(12) United States Patent
Ahmed et al.

(10) Patent No.: US 7,432,558 B1
(45) Date of Patent: Oct. 7, 2008

(54) FORMATION OF SEMICONDUCTOR DEVICES TO ACHIEVE <100> CHANNEL ORIENTATION

(75) Inventors: Shibly S. Ahmed, San Jose, CA (US); Judy Xilin An, San Jose, CA (US); Srikanteswara Dakshina-Murthy, Wappingers Falls, NY (US); Cyrus E. Tabery, Santa Clara, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/863,392

(22) Filed: Jun. 9, 2004

(51) Int. Cl.
    *H01L 29/72* (2006.01)
(52) U.S. Cl. .................... 257/368; 257/347; 257/401; 257/628
(58) Field of Classification Search ............... 257/368, 257/347, 401, 628
See application file for complete search history.

(56) References Cited

U.S. PATENT DOCUMENTS

| | | | |
|---|---|---|---|
| 5,171,703 A * | 12/1992 | Lin et al. ................. 438/198 |
| 6,867,460 B1 * | 3/2005 | Anderson et al. ............ 257/351 |
| 6,870,226 B2 * | 3/2005 | Maeda et al. ................ 257/347 |
| 2004/0150029 A1 * | 8/2004 | Lee ............................. 257/308 |
| 2005/0121676 A1 * | 6/2005 | Fried et al. .................... 257/72 |
| 2006/0255410 A1 * | 11/2006 | Bernstein et al. ............ 257/353 |
| 2006/0292889 A1 * | 12/2006 | Blanchard et al. ........... 438/761 |

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.
Xuejue Huang et al., "Sub-50 nm P-Channel FinFET," IEEE Transactions on Electron Devices, vol. 48, No. 5, May 2001, pp. 880-886.
Xuejue Huang et al., "Sub 50-nm FinFET: PMOS," 1999 IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.

* cited by examiner

*Primary Examiner*—Edward Wojciechowicz
(74) *Attorney, Agent, or Firm*—Harrity Snyder, LLP

(57) ABSTRACT

A semiconductor device may include a substrate and an insulating layer formed on the substrate. A fin may be formed on the insulating layer. The fin may include a side surface and a top surface, and the side surface may have a <100> orientation. A first gate may be formed on the insulating layer proximate to the side surface of the fin.

20 Claims, 11 Drawing Sheets

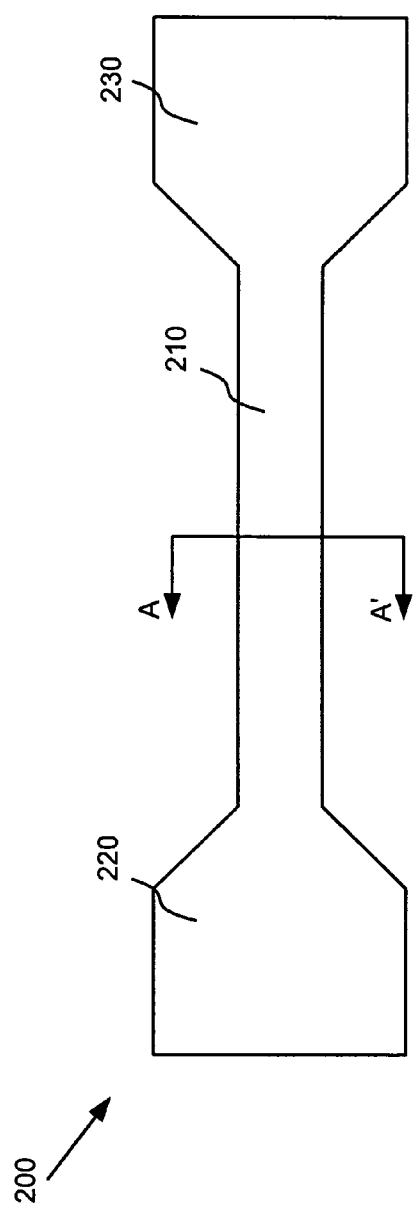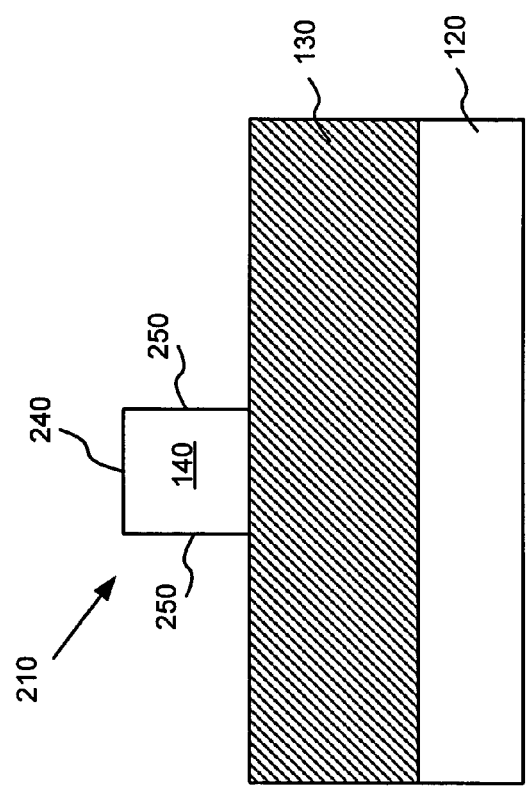

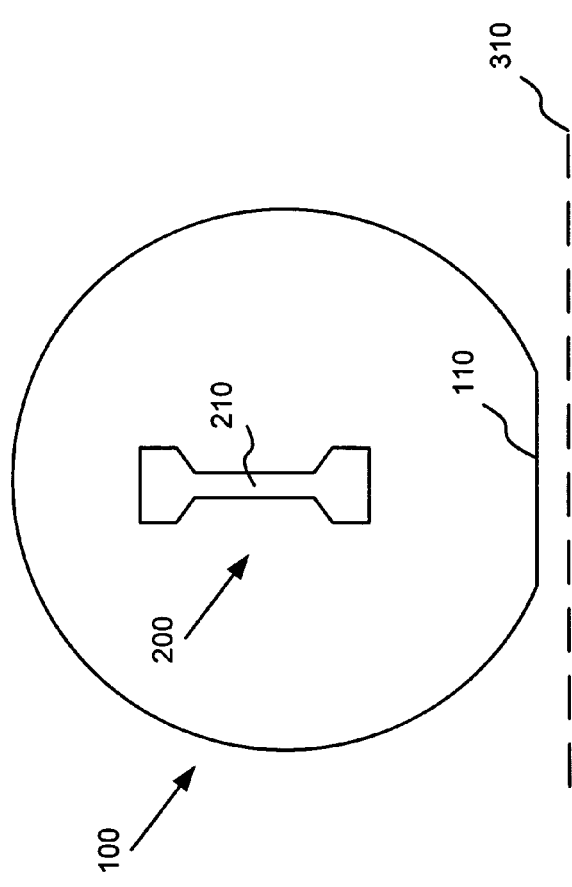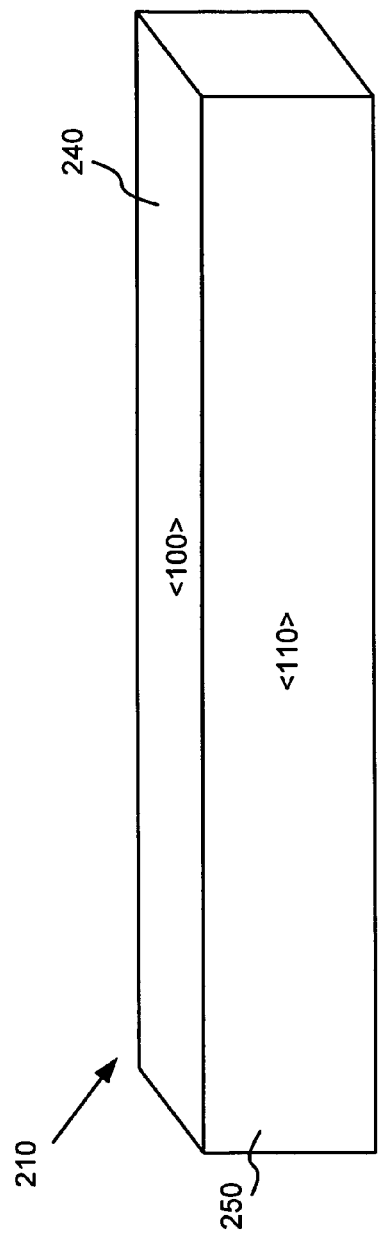
Fig. 3A
Fig. 3B

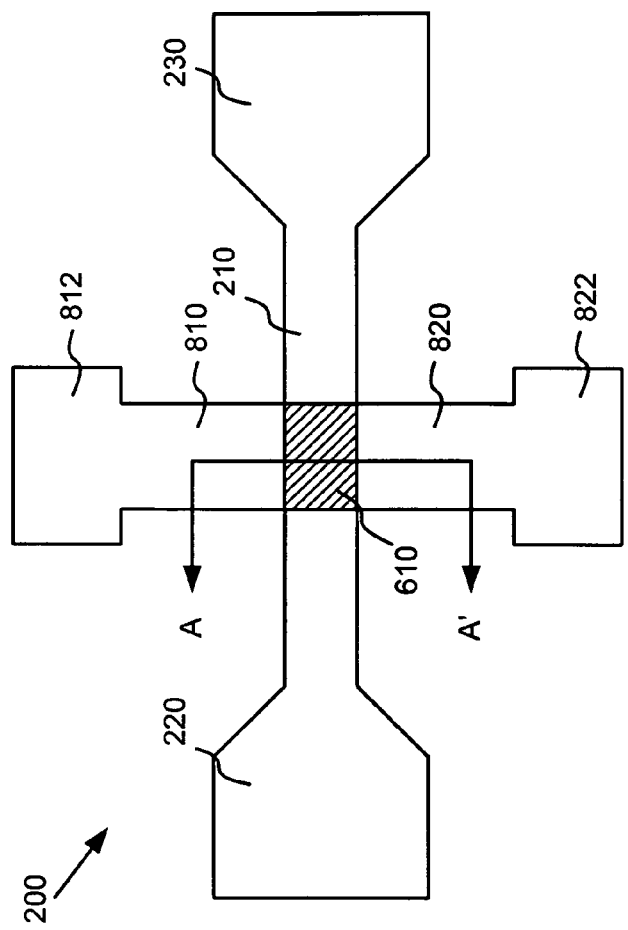
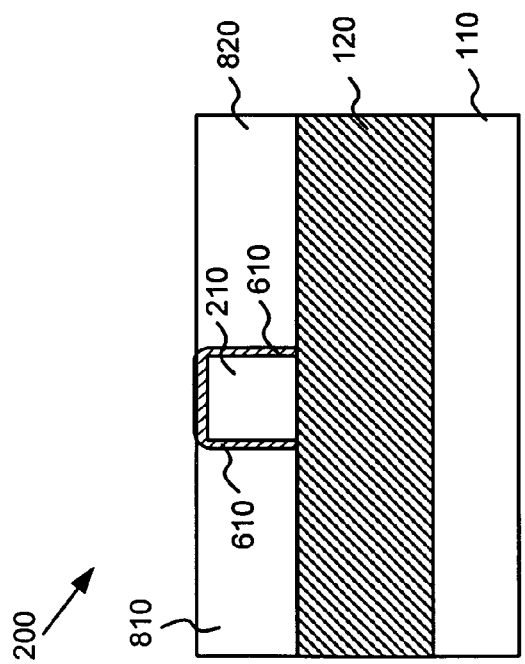
Fig. 8B
Fig. 8A

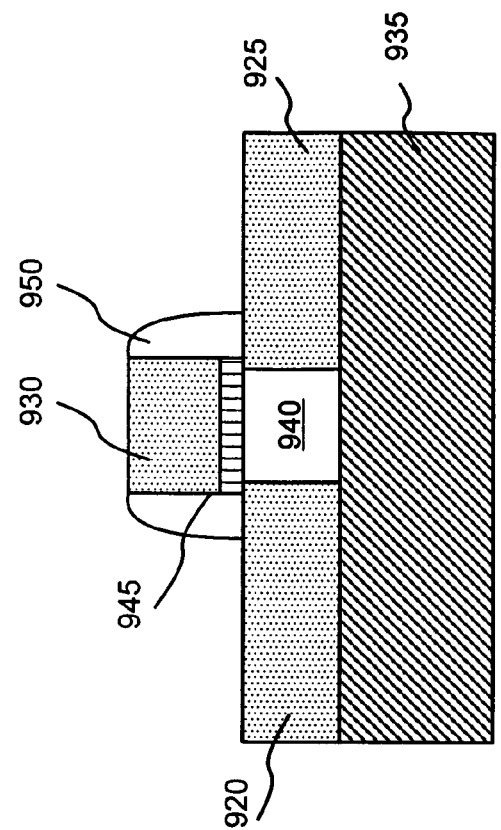
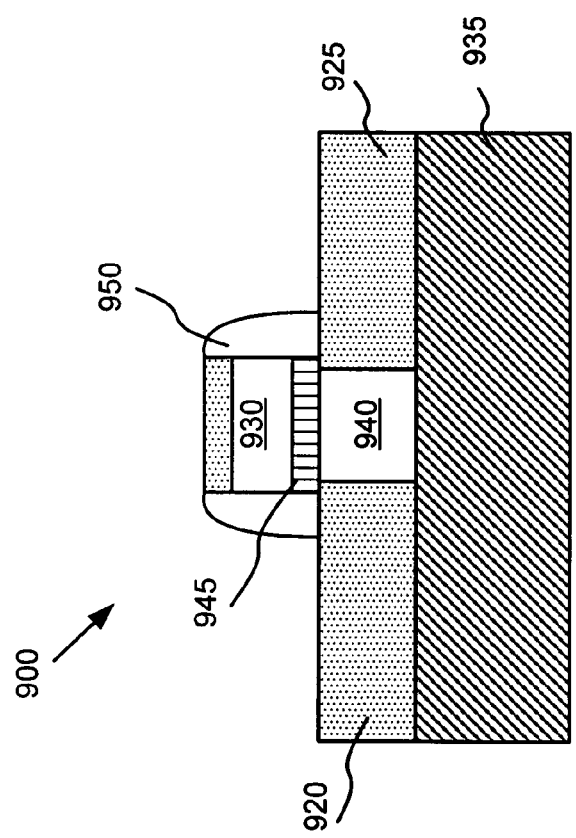

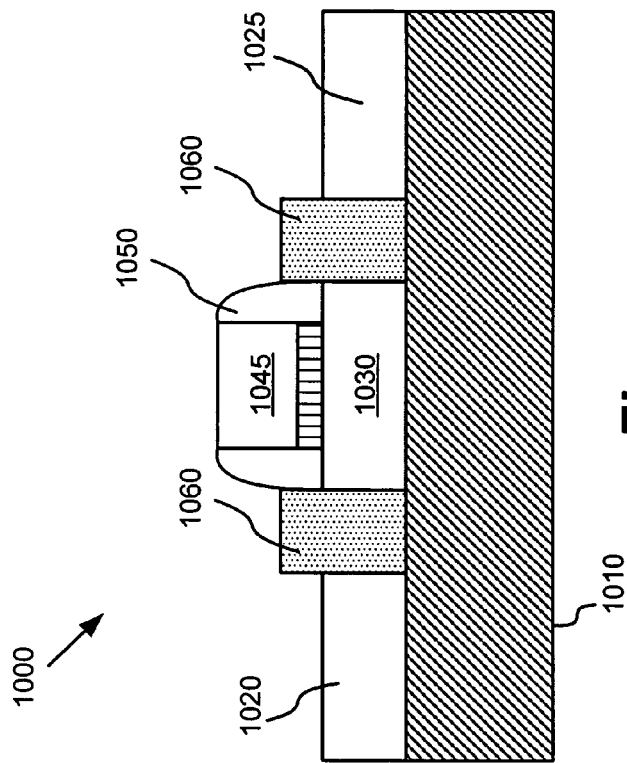
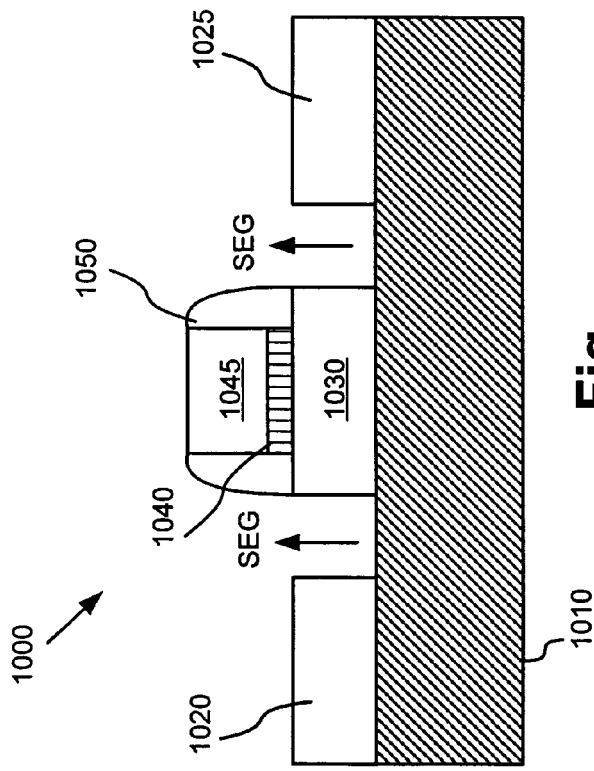
Fig. 10A
Fig. 10B

FORMATION OF SEMICONDUCTOR DEVICES TO ACHIEVE <100> CHANNEL ORIENTATION

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a FinFET device that has a <100> channel orientation.

Additional advantages and other features of the invention will be set forth in part in the description which follows and in part will become apparent to those having ordinary skill in the art upon examination of the following or may be learned from practice of the invention. The advantages and features of the invention may be realized and obtained as particularly pointed out in the appended claims.

According to the present invention, the foregoing and other advantages are achieved in part by a semiconductor device including a substrate and an insulating layer formed on the substrate. A fin may be formed on the insulating layer. The fin may include a side surface and a top surface, and the side surface may have a <100> orientation. A first gate may be formed on the insulating layer proximate to the side surface of the fin.

According to another aspect of the invention, a semiconductor device may include an insulating layer and a conductive fin disposed on the insulating layer. The fin may include a vertical channel in a <100> plane. A gate dielectric layer may be formed adjacent the conductive fin. A first gate electrode may be formed on the insulating layer and may be disposed on a first side of the conductive fin adjacent the gate dielectric layer.

According to a further aspect of the invention, a method of manufacturing a semiconductor device may include forming a fin structure on an insulator. The fin structure may include a vertical surface having a <100> orientation. The method may also include depositing a gate material over the fin structure and selectively removing the gate material to define a gate.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, where elements having the same reference number designation may represent like elements throughout.

FIGS. 2A and 2B are top and cross-sectional views illustrating the formation of a semiconductor device in accordance with an exemplary embodiment of the present invention.

FIG. 3A is a top view illustrating one orientation of the wafer of FIGS. 1A and 1B and a representative fin during processing.

FIG. 3B is a perspective view of the fin in FIG. 3A.

FIGS. 8A and 8B are cross-sectional and top views illustrating the formation of two gates in accordance with another exemplary embodiment of the present invention.

FIGS. 9A-9D are top and cross-sectional views illustrating full siliciding of a source/drain and gate in a FinFET in accordance with another implementation of the present invention.

FIGS. 10A and 10B are cross-sectional views illustrating selective epitaxial growth in a FinFET in accordance with another implementation of the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide a FinFET device that has a <100> channel orientation. A wafer may be rotated relative to a typical orientation during lithography to facilitate formation of the <100> channel(s).

Figure 1B:
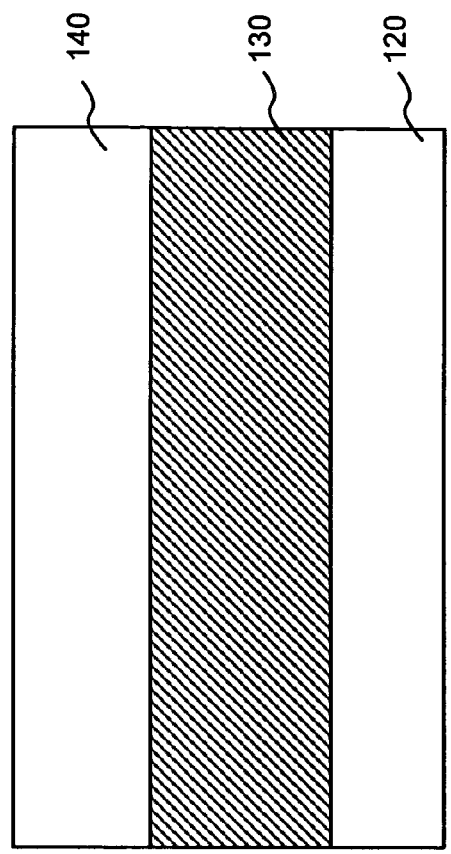
FIGS. 1A and 1B are top and cross-sectional views illustrating an exemplary wafer that may be used for forming a fin structure in accordance with an embodiment of the present invention.
Figure 1A:
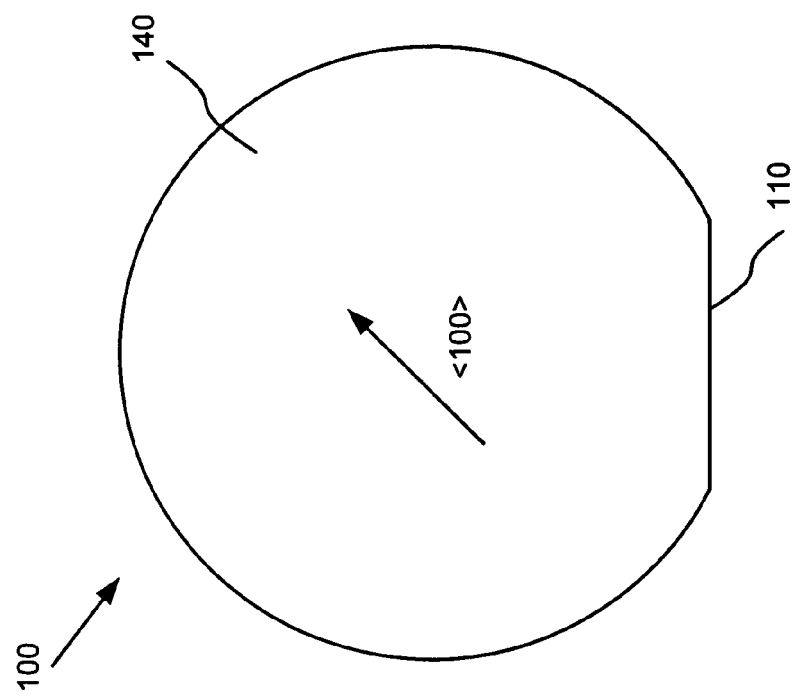

FIG. 1A illustrates a top view of a wafer 100 in accordance with an embodiment of the present invention. Wafer 100 may include a primary flat 110. Primary flat 110 may be used, possibly in conjunction with a secondary flat (not shown), to orient and/or identify a type (e.g., n-type or p-type) and crystalline orientation (e.g., <100> or <111>) of wafer 100.

FIG. 1B illustrates the cross-section of wafer 100 in accordance with an embodiment of the present invention. Referring to FIG. 1B, wafer 100 may include a silicon on insulator (SOI) structure that includes a silicon substrate 120, a buried oxide layer 130 and a silicon layer 140 on the buried oxide layer 130. Buried oxide layer 130 and silicon layer 140 may be formed on substrate 120 in a conventional manner.

In an exemplary implementation, buried oxide layer 130 may include a silicon oxide, such as $SiO_2$, and may have a thickness ranging from about 1500 Å to about 3000 Å. Silicon layer 140 may include monocrystalline or polycrystalline silicon having a thickness ranging from about 100 Å to about 1500 Å. Silicon layer 140 is used to form a fin for a FinFET transistor device, as described in more detail below.

In alternative implementations consistent with the present invention, substrate 120 and layer 140 may comprise other semiconducting materials, such as germanium, or combinations of semiconducting materials, such as silicon-germanium. Buried oxide layer 130 may also include other dielectric materials.

Returning to FIG. 1A, in one implementation consistent with the principles of the invention, silicon layer 140 may have a <100> crystalline orientation on its top surface. That is, the top surface of layer 140 in wafer 100 may lie along the <100> plane. Although the principles of the invention herein will be described using a <100> orientation for silicon layer 140, those skilled in the art will understand that these principles are applicable to other surface orientations (e.g., <111>) of layer 140.

FIGS. 2A and 2B are top and cross-sectional views illustrating the formation of semiconductor device 200 in accordance with an exemplary embodiment of the present invention. FIG. 2A illustrates a top view of semiconductor device 200 including a fin 210 formed adjacent a source region 220 and a drain region 230, according to an exemplary embodiment of the present invention.

FIG. 2B illustrates a cross-section of semiconductor device 200 taken along line A-A' in FIG. 2A. As shown, fin 210 may be formed from the silicon layer 140 on buried oxide layer 130. Fin 210 may include a top surface 240 and two side surfaces 250.

Semiconductor device 200 in FIGS. 2A and 2B may be formed as follows. A photoresist material may be deposited and patterned to form a photoresist mask (not shown) on silicon layer 140 in FIG. 1B. The photoresist may be deposited and patterned in any conventional manner. Semiconductor device 200 may then be etched using the photoresist mask (not shown) in a conventional manner to form fin 210, with the etching terminating on buried oxide layer 130, as illustrated in FIG. 2B.

After the formation of fin 210, source and drain regions 220/230 may be formed adjacent the respective ends of fin 210. For example, in an exemplary embodiment, a layer of silicon, germanium or combination of silicon and germanium may be deposited, patterned and etched in a conventional manner to form source and drain regions 220/230.

FIG. 3A is a top view illustrating one orientation of wafer 100 and a representative semiconductor device 200 during processing. A reference line 310 may represent the front of a lithography apparatus through which wafer 100 is loaded for processing. Alternately, reference line 310 may designate any reference direction with respect to which the primary flat 110 of wafer 100 is typically oriented during lithography.

Representative semiconductor device 200, including fin 210, is shown solely to illustrate one orientation of fin 210 relative to reference line 310 during its formation. As illustrated, and as is typical for masks used during lithography, fin 210 is formed along a direction orthogonal to primary flat 110 (and reference line 310). It should be noted that semiconductor device 200 is not shown to scale in FIG. 3A (or subsequent figures, such as FIGS. 4A and 5A). Rather, it has been enlarged solely to better illustrate the orientation of fin 210 relative to reference line 310.

FIG. 3B is a perspective view of the fin 210 formed in the configuration shown in FIG. 3A. The crystalline orientation of the top surface 240 of fin 210 is <100>. The crystalline orientation of the side surfaces 250 of fin 210 is <110>. In a FinFET device that may be formed using fin 210, however, the channels of the FinFET device are in a vertical plane, such as in the vertical direction along side surfaces 250. Accordingly, the channels of the FinFET device that may be formed from fin 210 in FIG. 3B are in the <110> direction. Because electron mobility is lower in the <110> direction than in the <100> direction, the performance of any FinFET device formed using the fin 210 in FIGS. 3A and 3B would be sub-optimal.

Figure 4A:
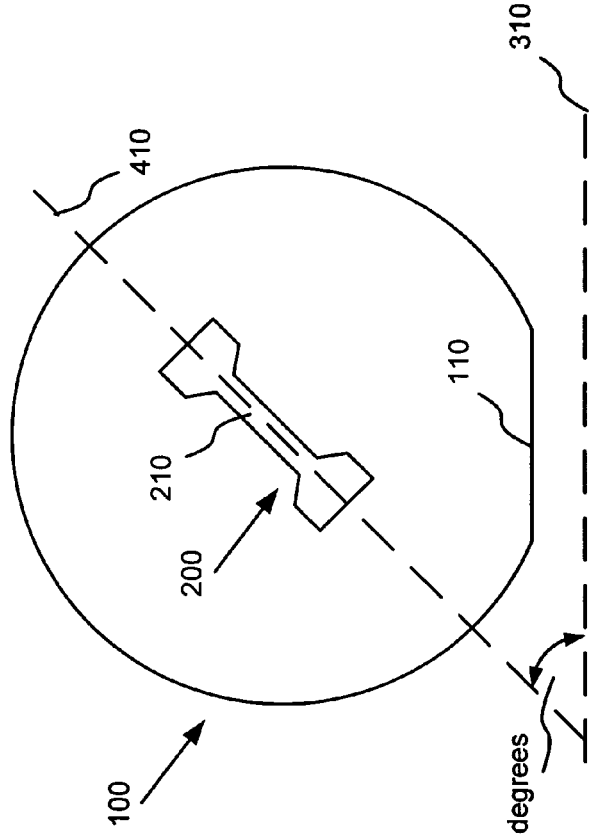
FIG. 4A is a top view illustrating an orientation of the wafer of FIGS. 1A and 1B and a representative fin during processing in accordance with an exemplary embodiment of the present invention.

FIG. 4A is a top view illustrating an orientation of wafer 100 and a representative semiconductor device 200 during processing in accordance with an exemplary embodiment of the present invention. As shown, the lithography mask(s) used to form semiconductor device 200 may be oriented so that fin 210 lies along axis 410, which is about 45 degrees offset from primary flat 110 (and reference line 310).

Figure 4B:
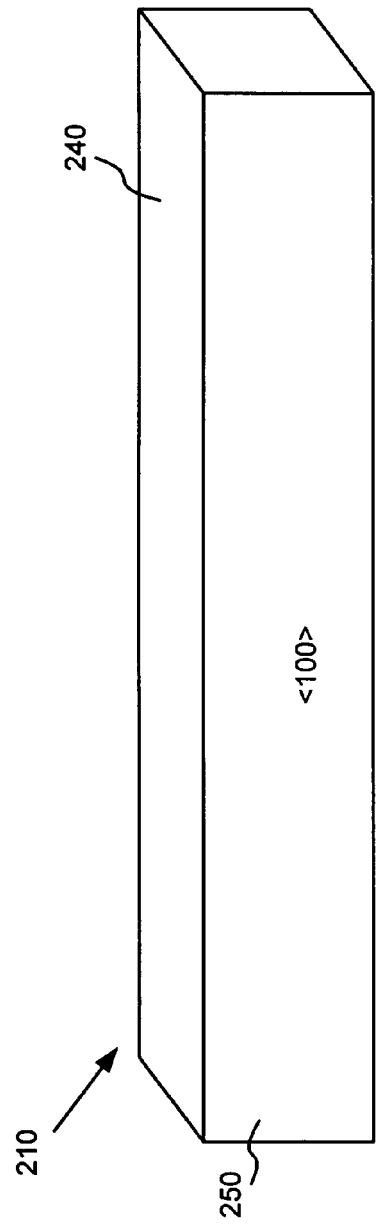
FIG. 4B is a perspective view of the fin in FIG. 4A.

FIG. 4B is a perspective view of the fin 210 formed in the configuration shown in FIG. 4A in accordance with an exemplary embodiment of the present invention. When the fin 210 is formed in such a 45 degree orientation relative to the primary flat 110, the side surfaces 250 of fin 210 (and other vertical planes within fin 210) have a <100> crystalline orientation. By orienting fin 210 in FIG. 4B during processing so that the vertical channel of a subsequently formed FinFET device is in the <100> direction, the performance of the FinFET device may be improved.

Setting up the lithography mask(s) to form semiconductor device 200 so that fin 210 lies along axis 410, however, may pose processing and device performance difficulties. For example, the features of semiconductor device 200 may not be well defined during the lithography and/or subsequent etching. Thus, even though the channel in FIGS. 4A and 4B is oriented in the preferred <100> direction, the performance of any FinFET device formed using the fin 210 in FIGS. 4A and 4B may still be sub-optimal due to imprecisely defined features.

Figure 5A:
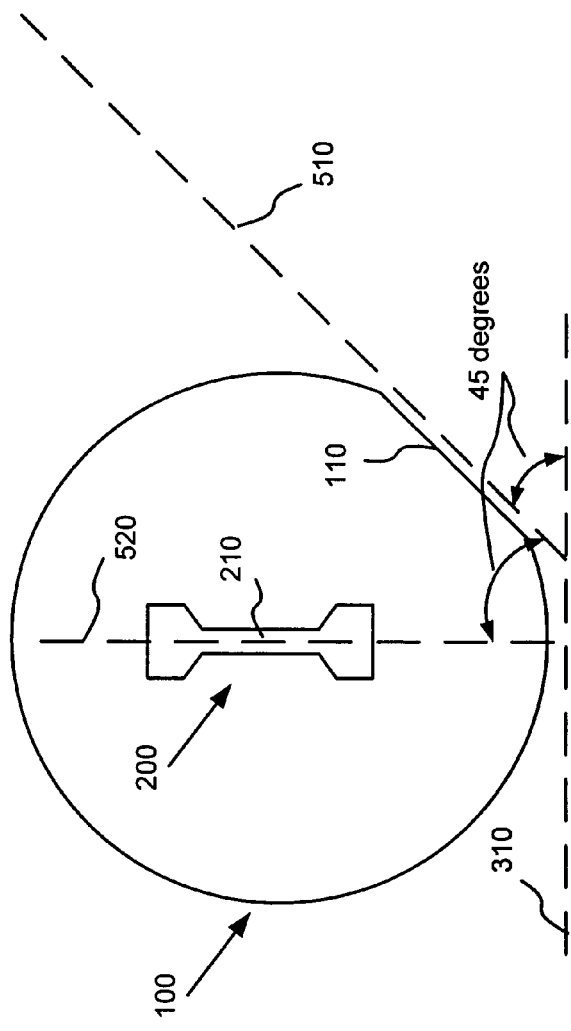
FIG. 5A is a top view illustrating an orientation of the wafer of FIGS. 1A and 1B and a representative fin during processing in accordance with another exemplary embodiment of the present invention.

FIG. 5A is a top view illustrating an orientation of wafer 100 and a representative semiconductor device 200 during processing in accordance with another exemplary embodiment of the present invention. Before processing, wafer 100 may be rotated 45 degrees counter-clockwise so that primary flat 110 lies along axis 510, which is 45 degrees offset from reference line 310. Similar to FIGS. 3A and 3B, the mask(s) used during lithography are configured so that fin 210 is formed along a direction 520 orthogonal to reference line 310. It should be noted that the angle between axis 510 of the primary flat 110 and direction 520 of the fin 210 is 45 degrees, the same as the angle between the primary flat 110 and the fin 210 in FIG. 4A. Wafer 100 FIG. 5A differs from wafer 100 in FIG. 4A, because wafer 100 is rotated 45 degrees from reference line 310 in FIG. 5A, whereas the lithography mask(s) are rotated 45 degrees in FIG. 4A.

Figure 5B:
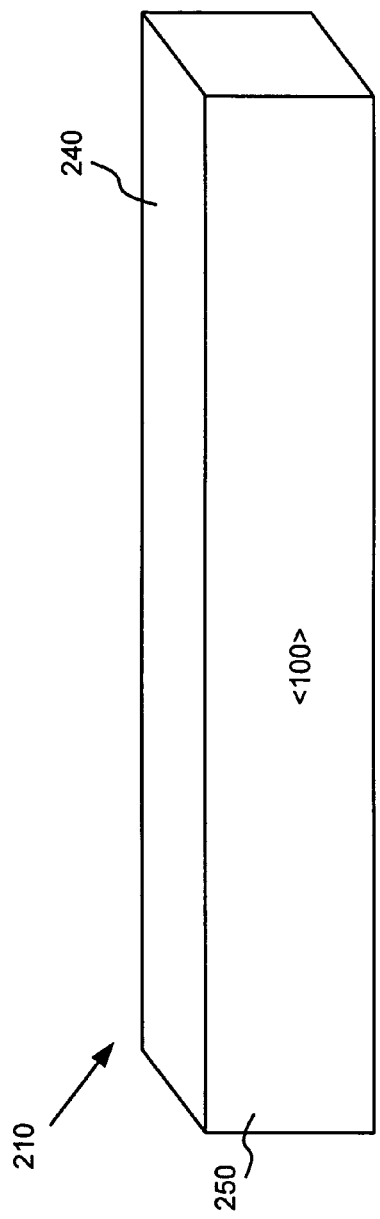
FIG. 5B is a perspective view of the fin in FIG. 5A.

FIG. 5B is a perspective view of the fin 210 formed in the configuration shown in FIG. 5A in accordance with an exemplary embodiment of the present invention. Because the fin 210 in FIGS. 5A and 5B is formed in such a 45 degree orientation relative to the primary flat 110, the side surfaces 250 of fin 210 (and other vertical planes within fin 210) have a <100> crystalline orientation. By orienting fin 210 in FIG. 5B during processing so that the vertical channel(s) of a subsequently formed FinFET device (e.g., side surfaces 250) are in the <100> direction, the performance of the FinFET device may be improved.

Like the configuration shown in FIG. 4A, the configuration of fin 210 in FIG. 5A results in channels within the fin 210 being oriented in the <100> direction, thereby achieving superior FinFET device performance. Unlike the configuration shown in FIG. 4A, however, the configuration of fin 210 in FIG. 5A does not increase process complexity, because there is no need to change existing lithography mask(s) from their typical configuration(s) relative to reference line 310. Thus, by rotating wafer 100 by 45 degrees during lithography, side surfaces 250 of fin 210 will have a <100> crystalline orientation, and a subsequently formed FinFET device will exhibit better channel performance. Hence, the configuration of wafer 100 shown in FIG. 5A is optimal when forming the semiconductor device 200 shown in FIGS. 2A and 2B.

Although FIG. 5A and its associated description refer to a 45 degree rotation of wafer 100 during lithography, other rotation angles may be used to obtain a fin 210 with side surfaces 250 oriented along the <100> plane. For example, wafer 100 may be rotated 225 degrees (i.e., 45 degrees plus 180 degrees) counter-clockwise during lithography to obtain <100> oriented side surfaces 250. Those skilled in the semiconductor fabrication art will understand that wafer 100 and/or semiconductor device 200 may be rotated other angles and/or directions given the guidance described herein to obtain a fin 210 with side surfaces 250 oriented along the <100> plane.

Figure 6:
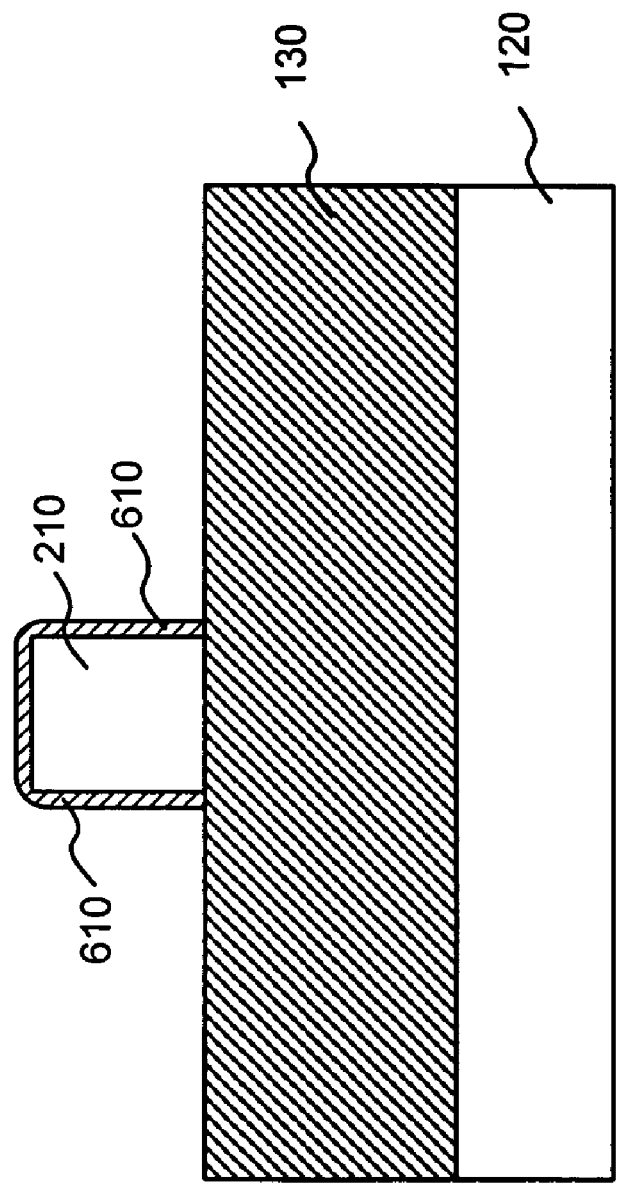
FIG. 6 is a cross-section illustrating the formation of a gate dielectric layer on the fin of FIG. 5A in accordance with an exemplary embodiment of the present invention.

Processing may continue on semiconductor device 200 in FIG. 5A to complete a FinFET device. For example, a thin oxide film 610 (e.g., SiO$_2$) may be thermally grown or deposited on fin 210, as illustrated in FIG. 6. The cross-sectional view of FIG. 6 is taken along line A-A' in FIG. 2A. The oxide film 610 may be grown to a thickness of about 10 Å to about A and may be formed on the exposed silicon side surfaces 250 and top surface 240 of fin 210 to act as a gate dielectric layer.

Figure 7B:
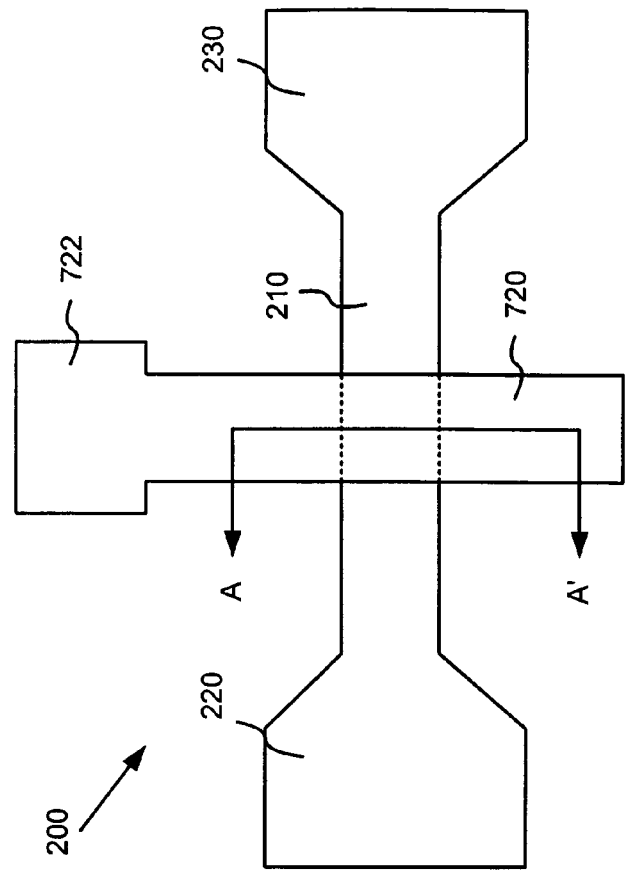
FIGS. 7A and 7B are cross-sectional and top views illustrating the formation of a gate in accordance with an exemplary embodiment of the present invention.
Figure 7A:
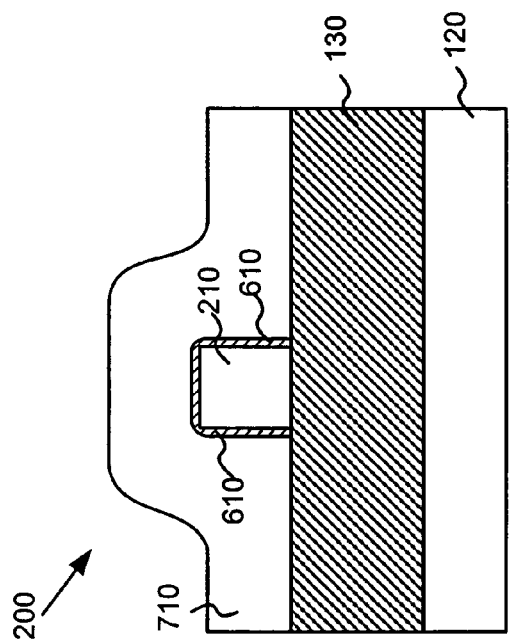

A gate material layer 710 may then be deposited over semiconductor device 100 in a conventional manner, as illustrated in FIG. 7A. The gate material layer 710 may be used for the subsequently formed gate(s). In an exemplary implementation, the gate material layer 710 may include polysilicon deposited using conventional chemical vapor deposition (CVD) to a thickness ranging from about 200 Å to about 1000 Å. Alternatively, other semiconducting materials, such as germanium or combinations of silicon and germanium, or various metals may be used as the gate material.

A bottom anti-reflective coating (BARC) layer and photoresist (not shown) may be deposited to facilitate etching of the gate material layer 710. After gate material layer 710 has been etched, any remaining photoresist and BARC material may be removed, resulting in semiconductor device 200 illustrated in FIG. 7B.

FIG. 7B illustrates a top view of semiconductor device 200 consistent with the present invention after the gate etching has been performed. Referring to FIG. 7B, the gate material layer 710 in FIG. 7A has been patterned and etched to form gate 720 for semiconductor device 200. As illustrated, semiconductor device 200 includes gate 720 disposed over either side of fin 210. Gate 720 may include gate electrode or contact 722 formed at one end, as illustrated in FIG. 7B. A metal, such as tungsten, cobalt, nickel, titanium, or tantalum, may be deposited over the gate 720 followed by a thermal annealing to form a metal-silicide compound on the top surface of gate 720.

In some implementations consistent with the present invention, the semiconductor device 200 illustrated in FIGS. 7A and 7B may be planarized, via for example, a chemical-mechanical polishing (CMP), to remove the portion of gate structure 720 above fin 210. In this implementation, the gate material in the vertical direction is approximately even with the gate oxide 610 located over the top surface of fin 210 as shown in FIG. 8A. In this case, gates 810 and 820 may be physically and electrically separated by fin 210 and may be separately biased during operation of semiconductor device 200.

FIG. 8B illustrates a top view of semiconductor device 200 consistent with such an implementation. As illustrated, semiconductor device 200 includes a double gate structure with gates 810 and 820 disposed on either side of fin 210 with gate dielectric 610 formed over the fin 210. Gates 810 and 820 may include gate electrodes or contacts 812 and 822 formed at the respective ends of gates 810 and 820, as illustrated in FIG. 8B. A metal, such as tungsten, cobalt, nickel, titanium, or tantalum, may be deposited over the gates 810 and 820 followed by a thermal annealing to form a metal-silicide compound on the top surfaces of gates 810 and 820.

The source/drain regions 220 and 230 (FIG. 7B or 8B) may then be doped to complete the formation of semiconductor device 200. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such steps are not disclosed herein in order not to unduly obscure the thrust of the present invention. In addition, sidewall spacers may optionally be formed prior to the source/drain ion implantation to control the location of the source/drain junctions based on the particular circuit requirements. Activation annealing may then be performed to activate the source/drain regions 220 and 230.

Thus, in accordance with the present invention, a FinFET device is formed in an efficient manner. Advantageously, the vertically-oriented channel(s) (e.g., side surfaces 250) in fin 210 of the FinFET device may be formed with a <100> crystalline orientation. Wafer 100 may be rotated relative to a typical orientation during lithography processing to facilitate formation of the <100> oriented channel(s) in fin 210. The resulting structure exhibits good short channel behavior. The present invention can also be easily integrated into conventional semiconductor fabrication processing.

OTHER IMPLEMENTATIONS

In some implementations, it may be desirable to fully silicide a source/drain and gate in a FinFET. FIGS. 9A-9D are top and cross-sectional views illustrating full siliciding of a source/drain and gate in a FinFET in accordance with another implementation of the present invention. FIG. 9A shows a top view of a FinFET 900 including a fin 910, a source region 920, and a drain region 925. A gate 930 including polysilicon may extend over and across the fin structure 910. The structure shown in FIG. 9A may be formed on a silicon on insulator structure.

Figure 9B:
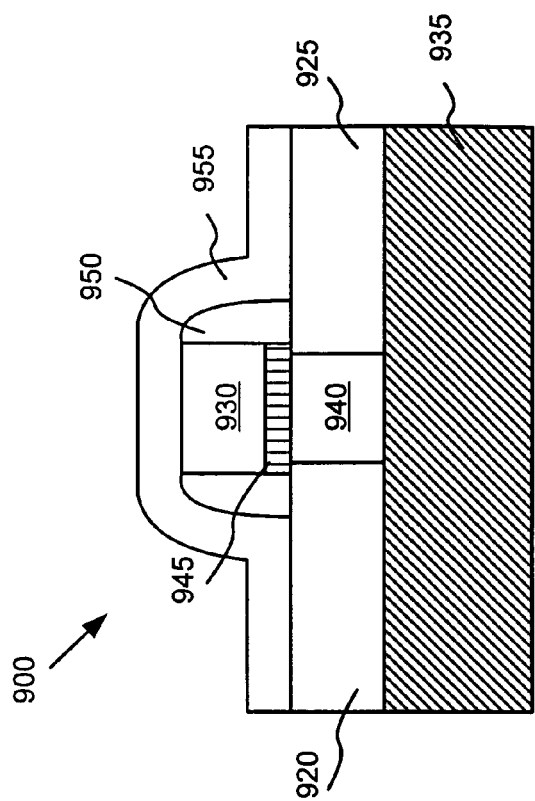
Figure 9A:
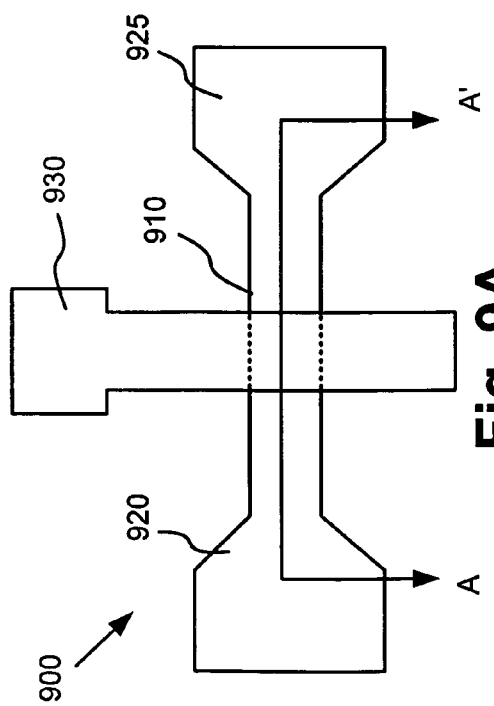

FIG. 9B shows a cross-section of the structure in FIG. 9A taken along line A-A'. A silicon layer on an oxide layer 935 may be patterned to form the fin structure in FIG. 9A, including source region 920, drain region 925, and channel region 940. A gate dielectric 945 may be formed over channel 940/fin 910. Next, gate 930 may be formed from patterning a polysilicon layer. Insulating spacers 950 may be formed adjacent the gate 930. Source and drain regions 920/925 may be doped. Finally, a metal 955, such as nickel or cobalt, may be deposited over source and drain regions 920/925 and gate 930.

FIGS. 9C and 9D show a cross-section of the structure in FIGS. 9A and 9B at a later stage of processing. The metal 955 may be annealed to fully silicide source and drain regions 920/925 as illustrated in FIG. 9C, thereby reducing resistance. Gate 930 may be partially silicided during this annealing (FIG. 9C) or fully silicided during this annealing (FIG. 9D). If full siliciding of gate 930 is desired in the same annealing step as the full siliciding of source and drain regions 920/925, the amount of polysilicon in gate 930 and the amount of metal 955 may be adjusted to ensure that gate 930 is fully silicided. In this manner, the source/drain and gate of FinFET 900 may be fully silicided.

In other implementations, reducing the source-drain resistance $R_{SD}$ in a FinFET may be desired. FIGS. 10A and 10B are cross-sectional views illustrating selective epitaxial growth (SEG) in a FinFET 1000 in accordance with another implementation of the present invention. Referring to FIG. 10A, FinFET 1000 includes a buried oxide (BOX) layer 1010 formed on a substrate (not shown), a source region 1020, a drain region 1025, a channel region 1030 (i.e., a fin), a dielectric cap 1040, a gate 1045, and sidewall spacers 1050. Dielectric cap 1040 may include silicon nitride (SiN) and gate 1045 may include polysilicon. These layers/structures may be formed in a conventional manner.

Portions of source region 1020 and drain region 1025 adjacent channel region 1030 may be removed, for example by etching, as illustrated in FIG. 10A. These removed portions of the fin may be replaced by an SEG process using heavily doped silicon. That is, heavily doped silicon may be deposited in the openings shown in FIG. 10A, and an SEG process may be performed to grow source/drain regions 1060, as shown in FIG. 10B. The heavily doped silicon 1060 portions may have a lower series resistance than the removed source/drain portions that they replaced. In this manner, source-drain resistance $R_{SD}$ of FinFET 1000 may be reduced by forming heavily doped silicon regions via an SEG process.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein. No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A semiconductor device, comprising:
   a substrate;
   an insulating layer formed on the substrate;
   a fin formed on the insulating layer and including a side surface and a top surface, wherein the side surface has a <100> orientation, a main axis of the fin being formed at an orientation of 45 degrees from a primary flat of a wafer on which the semiconductor device is formed, the primary flat of the wafer having a <110> orientation; and
   a first gate formed on the insulating layer proximate to the side surface of the fin.

2. The semiconductor device of claim 1, wherein the fin comprises silicon, and the side surface of the fin is oriented vertically relative to the insulating layer.

3. The semiconductor device of claim 2, wherein the side surface of the fin is oriented along a <100> plane in the silicon and the fin has a thickness ranging from about 100 Å to about 400 Å.

4. The semiconductor device of claim 1, further comprising:
   a second gate formed on the insulating layer separate from the first gate and proximate to another side surface of the fin.

5. The semiconductor device of claim 1, wherein the first gate is formed over the top surface of the fin and proximate to a plurality of side surfaces of the fin.

6. The semiconductor device of claim 1, further comprising:
   at least one dielectric layer formed between the fin and the first gate.

7. The semiconductor device of claim 1, further comprising:
   a source region and a drain region formed above the insulating layer and adjacent a respective first and second end of the fin.

8. The semiconductor device of claim 1, wherein the insulating layer comprises a buried oxide layer.

9. The semiconductor device of claim 1, wherein the top surface of the fin has a <110> orientation or a <111> orientation.

10. A semiconductor device, comprising:
    an insulating layer;
    a conductive fin disposed on the insulating layer, the fin including a vertical channel with a <100> crystal orientation, the conductive fin being formed at an orientation of about 45 degrees from a primary flat of a wafer on which the semiconductor device is formed, the primary flat of the wafer having a <110> orientation;

a gate dielectric layer formed adjacent to the conductive fin; and a first gate electrode formed on the insulating layer, the first gate electrode disposed on a first side of the conductive fin adjacent the gate dielectric layer.

11. The semiconductor device of claim 10, wherein the fin comprises silicon.

12. The semiconductor device of claim 11, wherein the vertical channel of the fin is oriented along a <100> plane in the silicon.

13. The semiconductor device of claim 10, further comprising:

a second gate electrode formed on the insulating layer, the second gate electrode disposed on an opposite side of the conductive fin adjacent the gate dielectric layer and spaced apart from the first gate electrode.

14. The semiconductor device of claim 10, wherein the first gate electrode is formed over a top surface of the fin and proximate to a plurality of side surfaces of the fin.

15. The semiconductor device of claim 10, further comprising:

a source region and a drain region formed above the insulating layer and adjacent a respective first and second end of the fin.

16. The semiconductor device of claim 4, further comprising:

a dielectric layer formed over a top surface of the fin wherein the first and second gates are electrically separated from each other and top surfaces of the first and second gates are co-planar with the dielectric layer.

17. The semiconductor device of claim 6, wherein the at least one dielectric layer comprises an oxide having a thickness ranging from about 10 Å to about 30 Å.

18. The semiconductor device of claim 10, wherein the conductive fin has a thickness of less than about 500 Å.

19. The semiconductor device of claim 10, wherein the gate dielectric layer has a thickness ranging from about 10 Å to about 30 Å.

20. The semiconductor device of claim 13, wherein the gate dielectric layer is further formed over a top surface of the conductive fin, the first and second gate electrodes are electrically separated from each other and top surfaces of the first and second gate electrodes are co-planar with the gate dielectric layer formed over the top surface of the conductive fin.

* * * * *

UNITED STATES PATENT AND TRADEMARK OFFICE
CERTIFICATE OF CORRECTION

PATENT NO. : 7,432,558 B1
APPLICATION NO. : 10/863392
DATED : October 7, 2008
INVENTOR(S) : Ahmed et al.

It is certified that error appears in the above-identified patent and that said Letters Patent is hereby corrected as shown below:

Column 5, line 50 reads: "A and may be formed on the exposed silicon side surfaces 250", and should read as follows: "30 Å and may be formed on the exposed silicon side surfaces 250"

Column 6, line 34 reads: "The source/drain regions 220 and 230 (FIG. 7B or 8B) may", and should read as follows: "The source/drain regions 220 and 230 (Figs. 7B or 8B) may"

Column 8, line 11 reads: "inventive concept as expressed herein. No element, act, or", and should read as follows: "inventive concept as expressed herein." [end paragraph, and begin new paragraph on line 12] "No element, act, or"

Signed and Sealed this

Twenty-fifth Day of November, 2008

JON W. DUDAS
*Director of the United States Patent and Trademark Office*